(12) United States Patent
Klumperink et al.

(10) Patent No.: US 7,319,851 B2
(45) Date of Patent: Jan. 15, 2008

(54) MIXER CIRCUIT, RECEIVER COMPRISING A MIXER CIRCUIT, WIRELESS COMMUNICATION COMPRISING A RECEIVER, METHOD FOR GENERATING AN OUTPUT SIGNAL BY MIXING AN INPUT SIGNAL WITH AN OSCILLATOR SIGNAL

(75) Inventors: Eric Antonius Maria Klumperink, Lichtenvoorde (NL); Simon Minze Louwsma, Enschede (NL); Eduard Ferdinand Stikvoort, Eindhoven (NL)

(73) Assignee: NXP B.V., Eindhoven (NL)

( * ) Notice: Subject to any disclaimer, the term of this patent is extended or adjusted under 35 U.S.C. 154(b) by 80 days.

(21) Appl. No.: 10/559,210

(22) PCT Filed: Jun. 1, 2004

(86) PCT No.: PCT/IB2004/050815

§ 371 (c)(1),
(2), (4) Date: Dec. 6, 2005

(87) PCT Pub. No.: WO2004/109904

PCT Pub. Date: Dec. 16, 2004

(65) Prior Publication Data

US 2006/0135109 A1    Jun. 22, 2006

(30) Foreign Application Priority Data

Jun. 10, 2003  (EP)  .................................. 03101685

(51) Int. Cl.
*H04B 1/26* (2006.01)
(52) U.S. Cl. ...................... 455/323; 455/334; 327/113

(58) Field of Classification Search ................ 455/323, 455/293, 313, 326, 131, 333, 334; 327/113, 327/117, 119
See application file for complete search history.

(56) References Cited

U.S. PATENT DOCUMENTS 5,825,231 A * 10/1998 Chevallier et al. .......... 327/356

(Continued)

*Primary Examiner*—Quochien B. Vuong

(57) ABSTRACT

The invention relates to a mixer circuit comprising an input node for receiving an input signal, a first output node 202, and a second output node 203, voltage to current conversion means and switching means operatively coupled to each other and to the input node, the first output node and the second output node to generate a mixed input signal at the first output node and the second output node in response to an oscillator signal. In an embodiment the voltage to current conversion means comprises a first and a second voltage to current converter, implemented as N-MOSFETs M2 and M3, with their gates connected to the input node. The drain of M2 is connected to the first output node 202, while the drain of the M3 is connected to the second output node M3. The source of M2 is connected to the switching node 221, while the source of M3 is connected to the second switching node 222. The switches SW are arranged to couple the first switching node 221 to a first supply voltage VDD and the second switching node 222 to a second supply voltage VSS during a first phase of the oscillator signal, and the first switching node 221 to VDD and the second switching node 222 to VSS during a second phase of the oscillator signal. The mixer circuit according to the invention may operate at low supply voltages by using switches connected only to the supply voltages VSS and VDD. Mixing is achieved by voltage to current converters GM1 and GM2, which are alternatingly activated by the switches SW.

10 Claims, 8 Drawing Sheets

U.S. PATENT DOCUMENTS 6,959,178 B2* 10/2005 Macedo et al. ............. 455/313
2003/0003891 A1* 1/2003 Kivekas et al. ............. 455/313
2004/0113679 A1* 6/2004 vanZeijl ..................... 327/359
2004/0142674 A1* 7/2004 Kuiri .......................... 455/334

* cited by examiner

US 7,319,851 B2

MIXER CIRCUIT, RECEIVER COMPRISING A MIXER CIRCUIT, WIRELESS COMMUNICATION COMPRISING A RECEIVER, METHOD FOR GENERATING AN OUTPUT SIGNAL BY MIXING AN INPUT SIGNAL WITH AN OSCILLATOR SIGNAL

Mixer circuit, receiver comprising a mixer circuit, wireless communication comprising a receiver, method for generating an output signal by mixing an input signal with an oscillator signal.

The invention relates to a mixer circuit comprising an input node for receiving an input signal, a first output node, and a second output node, voltage to current conversion means and switching means operatively coupled to each other and to the input node, the first output node and the second output node to generate a mixed input signal at the first output node and the second output node in response to an oscillator signal.

The invention further relates to a receiver for receiving radio frequency signals comprises an antenna section coupled to a receiver section, having a local oscillator for generating an oscillator frequency, being arranged to output a signal at another frequency.

The invention further relates to a wireless communication device comprises a receiver coupled to a signal processing section for processing the signal at the lower frequency generated by the receiver.

The invention further relates to a method for generating an output signal by mixing an input signal with an oscillator signal, whereby the output signal comprises a first output current and a second output current, in a mixer circuit comprising an input node for receiving the input signal, a first output node for providing the first output current, and a second output node for providing the second output current, voltage to current conversion means and switching means operatively coupled to each other and to the input node, the first output node, and the second output node to generate the output signal at the first output node and the second output node in response to the oscillator signal.

A known mixer circuit as described in the opening paragraph comprises a first N-channel type metal-oxide-semiconductor field effect transistor (N-MOSFET) for converting an radio frequency (RF) signal superimposed on a bias signal, applied at its gate, into a drain current at its drain, while its source is connected to a negative power supply rail. The known mixer circuit further comprises a second and a third N-MOSFET with their sources connected to the drain of the first N-MOSFET, the drain of the second N-MOSFET is a first current output node, and the drain of the third N-MOSFET is a second current output node. The second and third N-MOSFET are operated as switches. During a first phase of a local oscillator signal the second N-MOSFET is conductive, thereby passing on the drain current of the first N-MOSFET to the drain of the second N-MOSFET as a first output current. During a second phase of the local oscillator signal the third N-MOSFET is conductive, thereby passing on the drain current of the first N-MOSFET to the drain of the third N-MOSFET as a second output current.

Mixers are commonly used for frequency translation in radio frequency (RF) communications systems. The frequency translation results from multiplication of the RF input signal with a "local oscillator" (LO) signal. In practice, mixers are preferably implemented using so-called "hard switching" via a large LO signal, which mathematically corresponds to multiplication with a square wave, instead of a sine wave. This renders higher a conversion gain ($2/\pi$ instead of $\frac{1}{2}$), and a lower noise Fig. Especially in complementary metal-oxide-semiconductor (CMOS) and bipolar-metal-oxide-semiconductor (BiCMOS) integrated circuit process technologies, most mixer circuits exploit switching.

A known problem for the realization of analog circuits in current and future CMOS and BiCMOS technologies is a continuing trend in supply voltage reduction. This leads to non- or poorly conducting switches in the so-called "middle voltage range", which are somewhere between the positive and the negative power supply voltages and substantially different from these supply voltages. This problem expresses itself in analog and mixed analog-digital circuits comprising switches, such as analog-to-digital converters, digital-to-analog converters, but also in the known mixer circuit.

In operation the first N-MOSFET in the known mixer circuit for linearity of the voltage to current conversion it is required that there is sufficient gate-source and drain-source voltage headroom to operate in strong inversion and saturation. On the other hand it is required that the gate-source voltages of the second and third N-MOSFET are sufficiently large to establish a low-ohmic current path between the drain of the first N-MOSFET and the first and second current output node if the second, respectively the third N-MOSFET is switched on. This may either be achieved by operating the entire mixer circuit at a sufficiently high power supply voltage or by operating the mixer circuit at a lower power supply voltage and driving the gates of the second and third N-MOSFET separately at voltages well above the power supply voltage.

The first approach is disadvantageous, since it may require power supply voltages that are higher than allowed from an IC processing technology point of view, thereby deteriorating the reliability of the N-MOSFETs leading to a reduced operating lifetime of the mixer circuit. The second approach is disadvantageous, since the required driving circuits complicate circuit design, especially on high frequencies in the Giga-Hertz (GHz) range. Furthermore also in this approach reliability may an issue, because the required drive voltages are above the power supply voltage.

Amongst others it is an object of the invention to obtain a mixer circuit without requiring an increased power supply voltage or a driving circuit for supplying voltages outside the power supply voltage range.

To this end the invention provides a mixer circuit as defined in the opening paragraph which is characterized in that the voltage to current conversion means comprises:

a first voltage to current converter having a first control electrode coupled to the input node and a first main conductive path having a first output electrode coupled to the first output node and a first switching electrode coupled to the switching means;

a second voltage to current converter having a second control electrode coupled to the input node and a second main conductive path having a second output electrode coupled to the second output node and a second switching electrode coupled to the switching means; and the switching means is arranged to couple the first switching electrode to a first supply voltage and the second switching electrode to a second supply voltage during a first phase of the oscillator signal, and the first switching electrode to the second supply voltage and the second switching electrode to the first supply voltage during a second phase of the oscillator signal.

During operation the switching nodes of the first and second switchable voltage to current converters need to be drawn either to the first power supply voltage or the second power supply voltage. This requires switching means for establishing low ohmic conductive paths in the proximity of either the first or the second supply voltage, instead of switching means for establishing low ohmic conductive path at a voltage in the middle voltage range. This circumvents the need for operating the mixer circuit at a power supply voltage higher than desirable from a reliability point of view. Neither is it necessary to include driving circuit for obtaining voltages outside the power supply voltage range for driving the switching means.

A receiver as described in the second paragraph is characterized in that the receiver section comprises a mixer circuit according to the invention for mixing the oscillator signal with the radio frequency signals.

A wireless communication device as described in the third paragraph is characterized in that the receiver is a receiver according to the invention.

A method for generating an output signal by mixing an input signal with an oscillator signal as described in the fourth paragraph is characterized in that:

the voltage to current conversion means comprises:

a first voltage to current converter having a first control electrode coupled to the input node and a first main conductive path having a first output electrode coupled to the first output node and a first switching electrode coupled to the switching means;

a second voltage to current converter having a second control electrode coupled to the input node and a second main conductive path having a second output electrode coupled to the second output node and a second switching electrode coupled to the switching means; and the switching means coupling the first switching electrode to a first supply voltage and the second switching electrode to a second supply voltage during a first phase of the oscillator signal, and the first switching electrode to the second supply voltage and the second switching electrode to the first supply voltage during a second phase of the oscillator signal.

The above and other objects and advantageous features of the present invention will become more apparent from the following detailed description considered in connection with the accompanying drawings in which.

In these Figs. identical parts are identified with identical references.

Figure 1A:
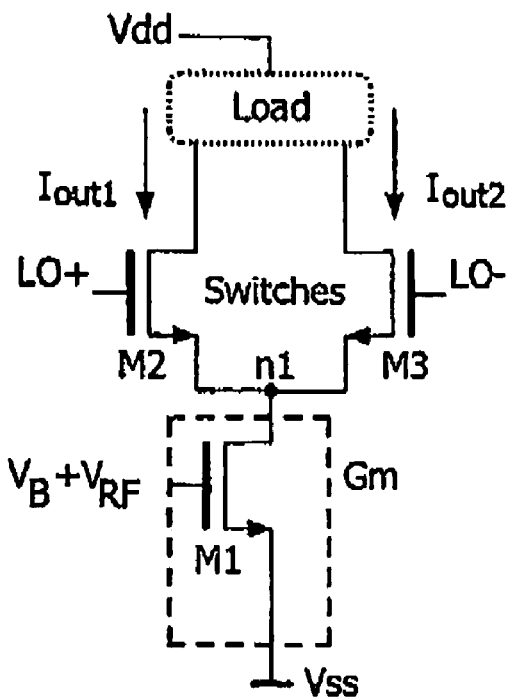
FIG. 1A shows a schematic diagram of a prior art mixer circuit.

FIG. 1A shows a schematic diagram of a prior art mixer circuit. It is a commonly used active mixer. It consists of a first N-MOSFET M1, a second N-MOSFET M2, a third N-MOSFET M3, and a load network LOAD. The source of the first N-MOSFET M1 is connected to the negative power supply rail VSS, the is drain connected to an internal node N1, while an input signal VB+VRF is provided at the gate. The source of the second N-MOSFET is connected to internal node N1, the drain is connected to the load network LOAD, while a first local oscillator signal LO+ is provided at its gate. The source of the third N-MOSFET is connected to internal node N1, the drain is connected to the load network LOAD, while a second local oscillator signal LO− is provided at its gate. Furthermore the load network LOAD is connected to the positive power supply rail VDD. The first N-MOSFET M1 forms a transconductance stage or voltage to current converter. The second N-MOSFET M2 and the third N-MOSFET M3 are switches.

The transconductance stage M1 is biased around a bias voltage VB and is designed to implement a linear voltage to current conversion of an input voltage signal VRF, superimposed on the bias voltage VB, into the variation of the drain current of the first N-MOSFET M1. For linearization purposes a source degeneration resistor may be inserted between the source of N-MOSFET M1 and the negative power supply rail VSS.

The switches M2 and M3 are driven by the first local oscillator signal LO+ and the second local oscillator signal LO−, which are in anti-phase with respect to each other. Both local oscillator signals are balanced around a bias voltage VBLO which is not indicated in FIG. 1A. To mimic the multiplication with a square wave signal at the local oscillator frequency, the amplitude of both local oscillator signals LO− and LO+ must be chosen sufficiently high to fully switch the transconductor current, provided at the drain of the transconductance stage M1 to either output current IOUT1, the drain current of N-MOSFET M1, or IOUT2, the drain current of N-MOSFET M2.

N-MOSFETs M2 and M3 are preferably operated in saturation to act alternatingly as cascode devices to N-MOSFET M1, thereby improving the output resistance and the linearity of the mixer circuit. Depending on the application the load network LOAD may be different. For instance, it may consist of two resistors respectively connecting the drains of N-MOSFETs M2 and M3 to the positive power supply rail VDD. This provides a wideband voltage conversion gain. Alternatively the load network LOAD may be a tuned LC network to provide gain only in a narrow frequency band. In either case the operation principle of the mixer circuit is the same.

To provide in operation a good linearity the N-MOSFET M1 in mixer circuit shown in FIG. 1A must have sufficient gate-source and drain-source voltage headroom: only if N-MOSFET M1 is well in strong inversion and saturation, the transconductance stage achieves a good linearity. To an IIP3 well above 0 dBm, typical minimum drain-source voltage values for a 0.18 μm CMOS process are in the range of 0.5 volt or more. With threshold voltages around 0.5 volt, this means that the minimum voltage of the gates of N-MOSFETs M2 and M3, to switch these devices on, is typically higher than 1 volt. Moreover, a large overdrive voltage for the switches M2 and M3 are required to achieve low switch resistances.

Therefore, either supply voltage well above 1 volt are required, or a switch driver circuit, driving the gates of switches M2 and M3 well above VDD. Such drivers are not easily implemented at operating frequencies in the GHz range, especially when wide bandwidth is required and LC tanks are impractical. Moreover, the maximum allowed gate voltage is decreasing for new technologies due to required reliability of the gate oxide of MOSFETs.

To address these problems, folded topologies have been proposed, e.g. P-MOSFET switches following a N-MOSFET transconductance stage. However such a mixer circuit requires adding a bias current source that adds substantial noise, unless significant voltage headroom is reserved (but then the switch again becomes the problem). In other popular mixers, like the passive mixer, very similar problems occur, especially in down conversion mixers, where AC coupling often is not possible (e.g. zero IF architecture) or requires very large capacitors (low IF architecture). The essence of the problem is the same: achieving low switch resistance at voltage levels in the middle range between the supply voltages is impossible without driving gates outside the supply. This problem becomes even more severe in future processes with even thinner gate-oxides and lower supply voltages, while threshold voltage only scale down slowly. Alternative mixer architectures able to operate at a low supply voltage directly compatible with digital CMOS technology are therefore desired.

Figure 1B:
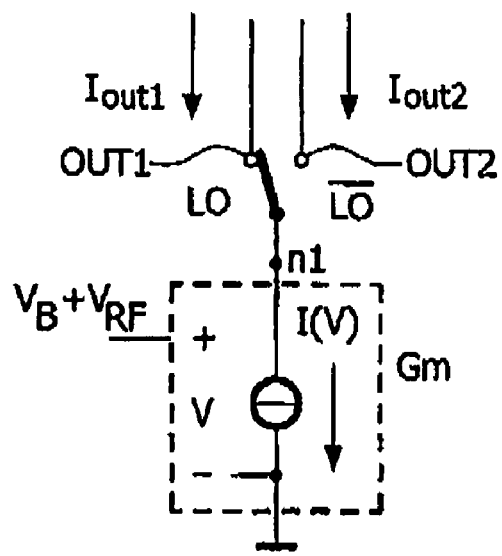
FIG. 1B shows a schematic functional representation of the prior art mixer circuit of FIG. 1A.

FIG. 1B shows a schematic functional representation of the prior art mixer circuit of FIG. 1A. It is a simplified representation of the mixer circuit shown in FIG. 1A. The transconductance stage M1 is represented by a voltage to current converter, voltage controller current source, GM with a first terminal connected to the internal node N1 and a second terminal connected to the negative supply voltage VSS, generating a current I(V) under control of the input signal VB+VRF applied at a control node. The switches M2 and M3 are represented by a switch driven by the logic signals LO, representing the local oscillator signal LO+, and its inverse $\overline{LO}$, representing the local oscillator signal LO−, switching the current generated by the voltage to current converter GM to a first output node OUT1 as a first output current IOUT1 and a second output node OUT2 as a second output current IOUT2.

Figure 2A:
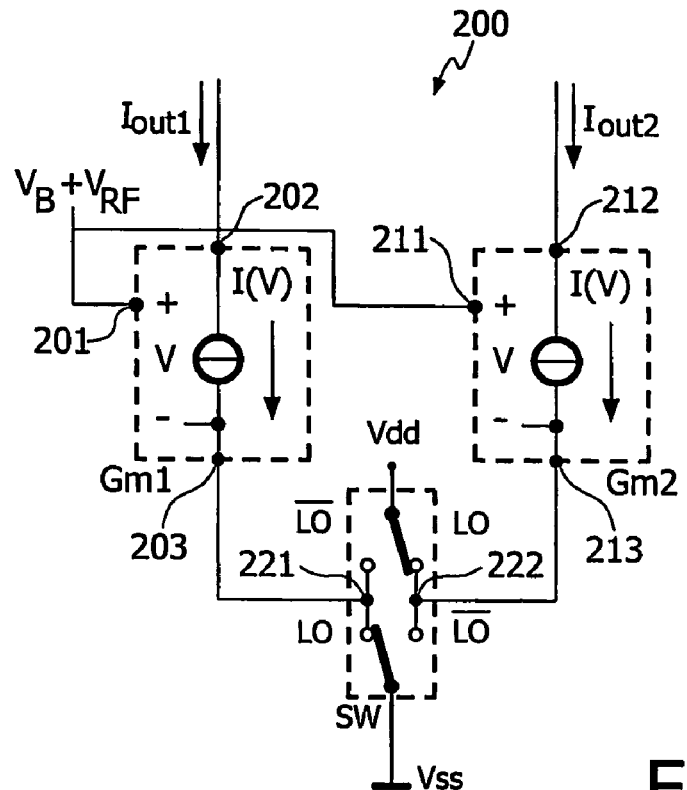
FIG. 2A shows a schematic functional representation of a an embodiment of a mixer circuit according to the invention.

FIG. 2A shows a schematic functional representation of a an embodiment of a mixer circuit 200 according to the invention. The shown mixer circuit 200 is a so-called single balanced switched transconductance mixer. It comprises two matched transconductors or voltage to current converters GM1 and GM2. An input signal VB+VRF is applied to the control terminals 201, 211 of both transconductors GM1 and GM2. An output current IOUT1 is provided at output terminal 202 of the transconductor GM1 and a switching terminal 203 is coupled to a first switching node 221. An output current IOUT2 is provided at output terminal 212 of the transconductor GM2 and a switching terminal 213 is coupled to a second switching node 222. By means of the switches SW the first switching node 221 is switched to the negative supply voltage VSS during a first phase LO of a local oscillator signal, while simultaneously the second switching node 222 is switched to the positive power supply VDD. During a second phase $\overline{LO}$ of the local oscillator signal the first switching node 221 is switched to the positive power supply VDD, wile simultaneously the second switching node 222 is switched to the negative power supply VSS.

The key to the mixer circuit according to the invention is the observation that the problems related to the known mixer circuit as shown in FIG. 1a and FIG. 1b relate to requiring a conductive channel at a voltage level in the middle range between the supplies VSS and VDD. However, it is easily possible to make low ohmic switches, provided that their conductive channel is connected to VSS (N-MOSFET) or VDD (P-MOSFET). This can be relied upon even in future CMOS technologies, for the simple reason that digital logic circuits rely on this functionality (inverters).

The mixer circuit 200 shown in FIG. 2A conceptually, illustrates how a single balanced mixer circuit according to the invention can be constructed using two matched transconductors GM1 and GM2 and switches SW connected to supply voltages VSS and VDD only. The transconductors GM1 and GM2 are alternatingly switched on by switching their respective switching terminals 203, 213 to the negative supply voltage VSS, and switched off by switching their respective switching terminals 203, 213, to the positive supply voltage VDD. As explained GM1 is on, if GM2 is off, and the other way around. For matched transconductors and ideal instantaneous switching, either IOUT1 or IOUT2 is equal to the product GmVrf, just as in the known mixer circuit shown in FIG. 1A and FIG. 1B, whereby Gm represents the transconductance factor of the transconductors GM1 and GM2 and VRF the input voltage signal. Actually, both said known mixer circuit and the mixer circuit 200 implement the same mixer function in different ways: said known mixer by a voltage to current conversion followed by current switching, the mixer circuit 200 according to the invention by directly switching transconductors (activate either one of the two "Switched Transconductors" GM1 and GM2).

Figure 2B:
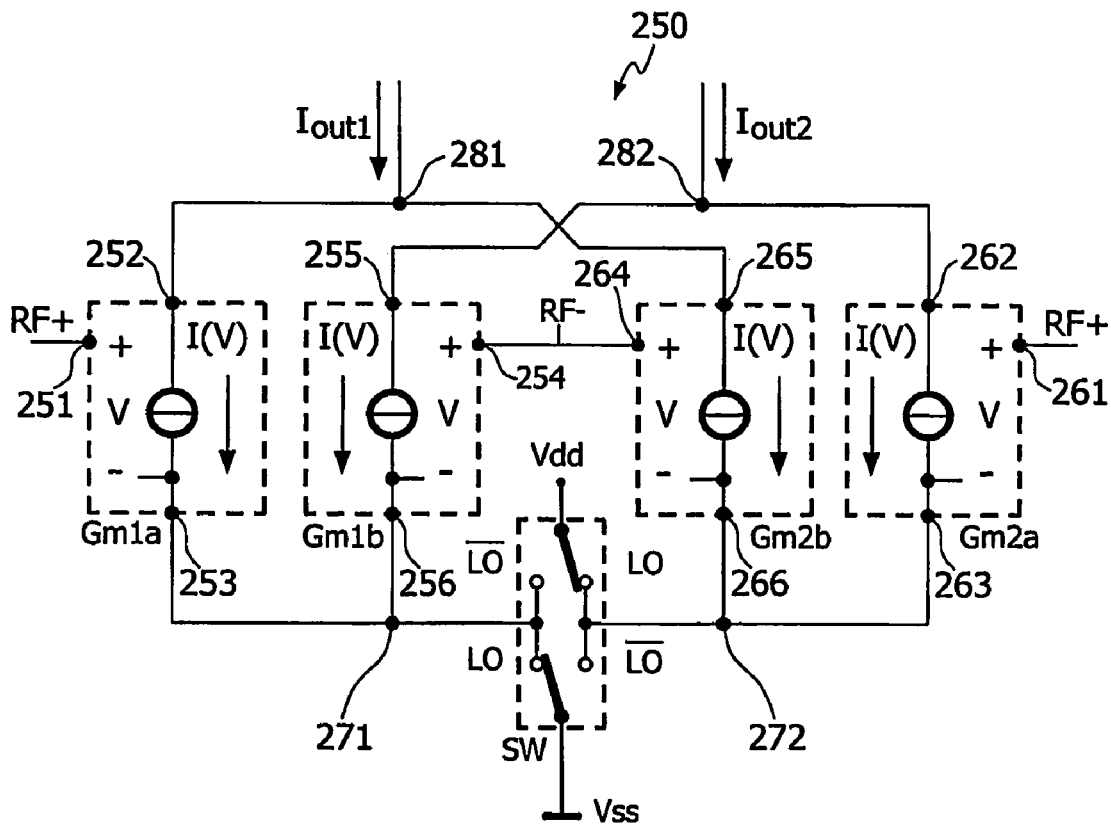
FIG. 2B shows a schematic functional representation of another embodiment of a mixer circuit according to the invention.

FIG. 2B shows a schematic functional representation of another embodiment of a mixer circuit 250 according to the invention. The shown mixer circuit 250 is a so-called double balanced switched transconductance mixer. It comprises four matched transconductors or voltage to current converters GM1a, GM1b, GM2a, GM2b. An input signal RF+ is applied to the control terminals 251, 261 of transconductors GM1a and GM2a respectively. An input signal RF− is applied to the control terminals 254, 264 of transconductors GM1b and GM2b respectively. Output terminals 252, 265 of transconductor GM1a and GM2b respectively are coupled to a first output node 281 for providing an output current IOUT1. Output terminals 262, 255 of transconductors GM2a and GM1b respectively are coupled to a second output node 282 for providing an output current IOUT2. Switching terminals 253, 256 of transconductors GM1a and GM1b respectively are coupled to a first switching node 271. Switching terminals 263, 266 of transconductors GM2a and GM2b respectively are coupled to a second switching node 272. By means of the switch SW the first switching node 271 is switched to the negative supply voltage VSS during a first phase LO of a local oscillator signal, while simultaneously the second switching node 272 is switched to the positive power supply VDD. During a second phase $\overline{LO}$ of the local oscillator signal the first switching node 271 is switched to the positive power supply VDD, wile simultaneously the second switching node 272 is switched to the negative power supply VSS.

Figure 2C:
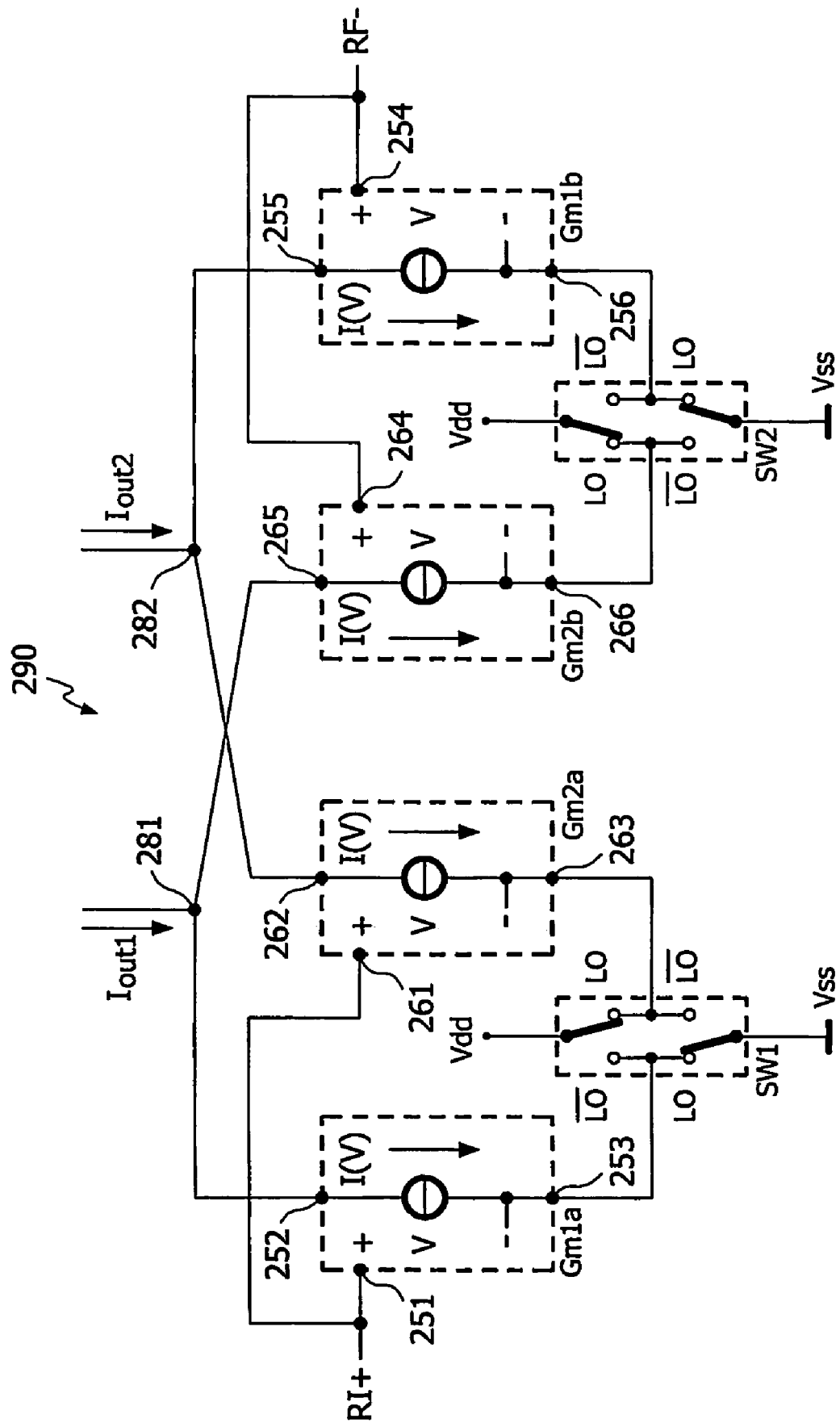
FIG. 2C shows a schematic functional representation of yet another embodiment of a mixer circuit according to the invention.

FIG. 2C shows a schematic functional representation of yet another embodiment of a mixer circuit 290 according to the invention. As with the mixer circuit 250 shown in FIG. 2B, mixer circuit 290 is a double balanced switched transconductance mixer. It comprises four matched transconductors or voltage to current converters GM1a, GM1*b*, GM2*a*, and GM2*b* respectively. An input signal RF+ is applied to the control terminals 251, 261 of transconductors GM1*a* and GM2*a* respectively. An input signal RF− is applied to the control terminals 254, 264 of transconductors GM1*b* and GM2*b* respectively. Output terminals 252, 265 of transconductors GM1*a* and GM2*b* respectively are coupled to a first output node 281 for providing an output current IOUT1. Output terminals 262, 255 of transconductors GM2*a* and GM1*b* respectively are coupled to a second output node 282 for providing an output current IOUT2. The switching terminal 253 of transconductor GM1*a* and the switching terminal 263 of transconductor GM2*a* are coupled to a first switch SW1. The switching terminal 256 of transconductor GM1*b* and the switching terminal 266 of transconductor GM2*b* are coupled to a second switch SW2. By means of the switches SW1 and SW2 the switching terminals of transconductors GM1*a* and GM1*b* are switched to the negative supply voltage VSS during a first phase LO of a local oscillator signal, while simultaneously the switching terminals of transconductors GM2*a* and GM2*b* are switched to the positive power supply VDD. During a second phase $\overline{LO}$ of the local oscillator signal the switching terminals of transconductors GM1*a* and GM1*b* are switched to the positive power supply VDD, while simultaneously the switching terminals of transconductors GM2*a* and GM2*b* are switched to the negative power supply VSS.

The single balanced mixer circuit 200 shown in FIG. 2A has a strong output signal at the LO-frequency, which can be cancelled in the double balanced mixer circuit 250. By adding the transconductors GM1*b* and GM2*b* driven by an RF-signal RF− which is the anti phase version of the RF-signal RF+ driving the transconductors GM1*a* and GM2*a*, this is readily implemented. The double balanced switched transconductor mixer circuit 250 has the same nominal conversion gain as the double balanced version of the known mixer circuit shown in FIG. 1A.

Despite of the functional equivalence, there are also significant differences. Most notably, in the known mixer circuit of FIG. 1A there is an internal node N1 between the transconductor GM and the output node, which renders bandwidth limitations due to parasitic capacitance and also distortion and noise effects. This internal node is lacking in the switched transconductor mixer circuits 200, 250 according to the invention. Moreover, the switches SW to the negative supply voltage VSS constitute a common-mode current path for the two active transconductors to the output nodes 281, 282. This ideally renders a constant common-mode output current, for ideal instantaneous switching. In practice, switching transients occur with most energy concentrated at $2f_{LO}$, whereby $2f_{LO}$ represents the frequency of the local oscillator signal. This can easily be filtered out by capacitors to ground. These common-mode currents also come with noise, however this hardly harms the noise fig. of the mixer circuits 200, 250 according to the invention.

As indicated above the noise current introduced by the switching devices SW is a common mode noise current. Thus, this noise current cancels in the differential output current, which is the difference IOUT1-IOUT2 of the first output current IOUT1 and the second output current IOUT2. For the known mixer circuit shown in FIG. 1A the situation is completely different. This is because there is a direct noise current path between the outputs OUT1 and OUT2: when the local oscillator signals LO+ and LO− have approximately the same value, both switch transistors M2 and M3 conduct and have significant noise current, resulting in a noise peak around the zero-crossing. Also, local oscillator noise is amplified during this time interval. This noise comes on top of the noise of the transconductance stage M1, and dominates at high frequencies where the "zero-crossing region" constitutes a large portion of the local oscillator signal cycle time period. A similar effect occurs in passive mixers. In contrast, the switched transconductor mixers 200, 250 according to the invention do not show this effect, as noise generated by the switches SW is common mode noise.

Figure 3:
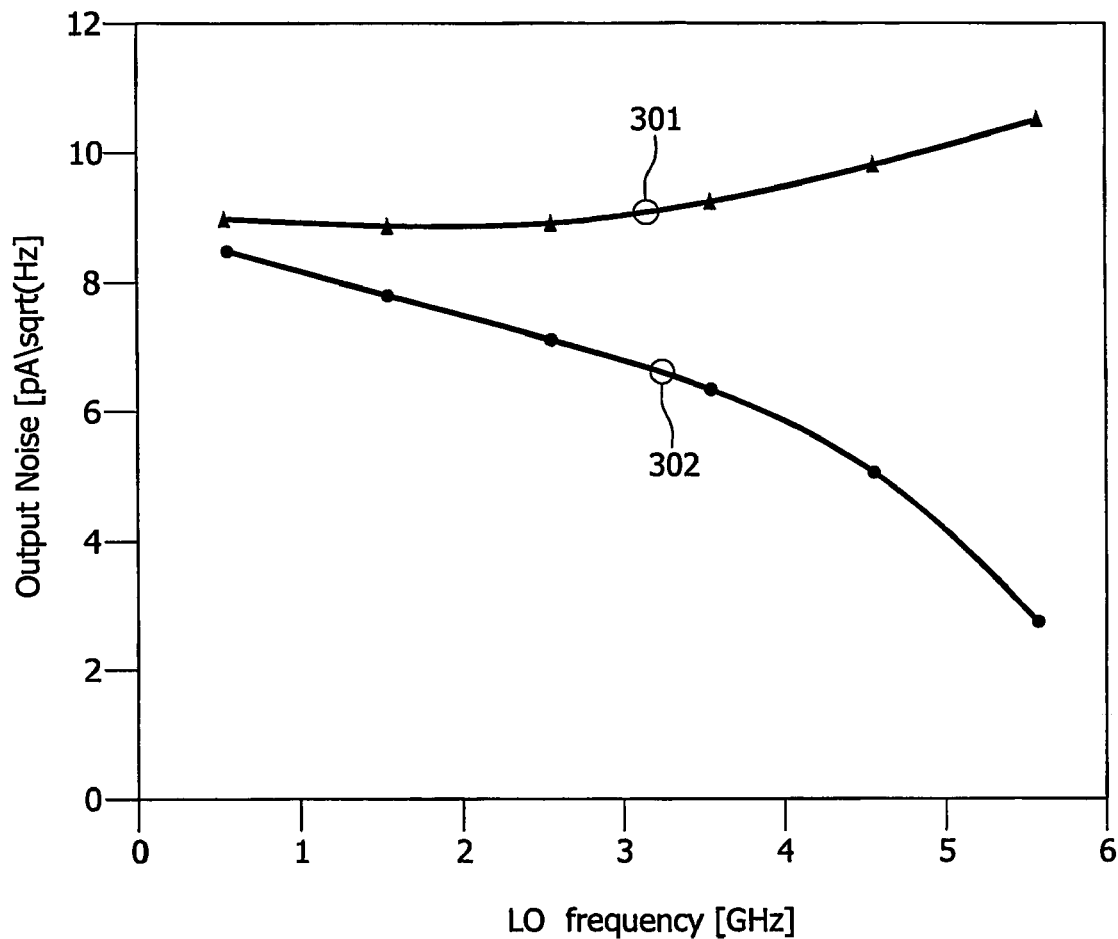
FIG. 3 shows graphs with simulated thermal output noise current density versus a local oscillator frequency for both a mixer circuit according to the invention and a known mixer circuit.

FIG. 3 shows graphs with simulated thermal output noise current density versus a local oscillator frequency for both a mixer circuit according to the invention and a known mixer circuit. The vertical axis shows the output noise in pA/sqrt (Hz), while the horizontal axis shows the local oscillator frequency in GHz. Graph 301 shows the simulated thermal output noise in dependence upon the local oscillator frequency of a known mixer circuit as shown in FIG. 1A. Graph 302 shows the simulated thermal output noise in dependence upon the local oscillator frequency of a mixer circuit according to the invention as shown in FIG. 2A.

In both cases the transconductor is implemented using N-MOSFETs with W/L=15/0.3, nominally biased at $V_{GS}=V_{DS}=0.65$ Volt (0.5 Volt threshold voltage). The switches have W/L=15/0.18 (NMOST) and 30/0.18 (PMOST), and are driven with a 0 dBm local oscillator power (50 ohm termination, balanced signals around a common mode voltage $V_{dd}/2$). The conversion transconductance is around 1 mS, and the bandwidth of both mixers is around 4 GHz. FIG. 3 shows the simulated thermal output noise current density with a low-ohmic termination of both the switched transconductor mixer circuit according to the invention and the known active mixer circuit.

Clearly the output noise behavior for both mixer circuits is very different: where the output noise of switched transconductor according to the invention, shown in graph 302, decreases (roughly following the frequency roll-off of the conversion transconductance), the output noise of the known mixer circuit, shown in graph 301, increases. The low noise of the switched transconductor mixer circuit according to the invention is highly desired, because Low Noise Amplifiers (LNAs) usually have decreasing gain at high frequencies, thus increasing the relevance of low mixer noise at high local oscillator frequencies.

Figure 4:
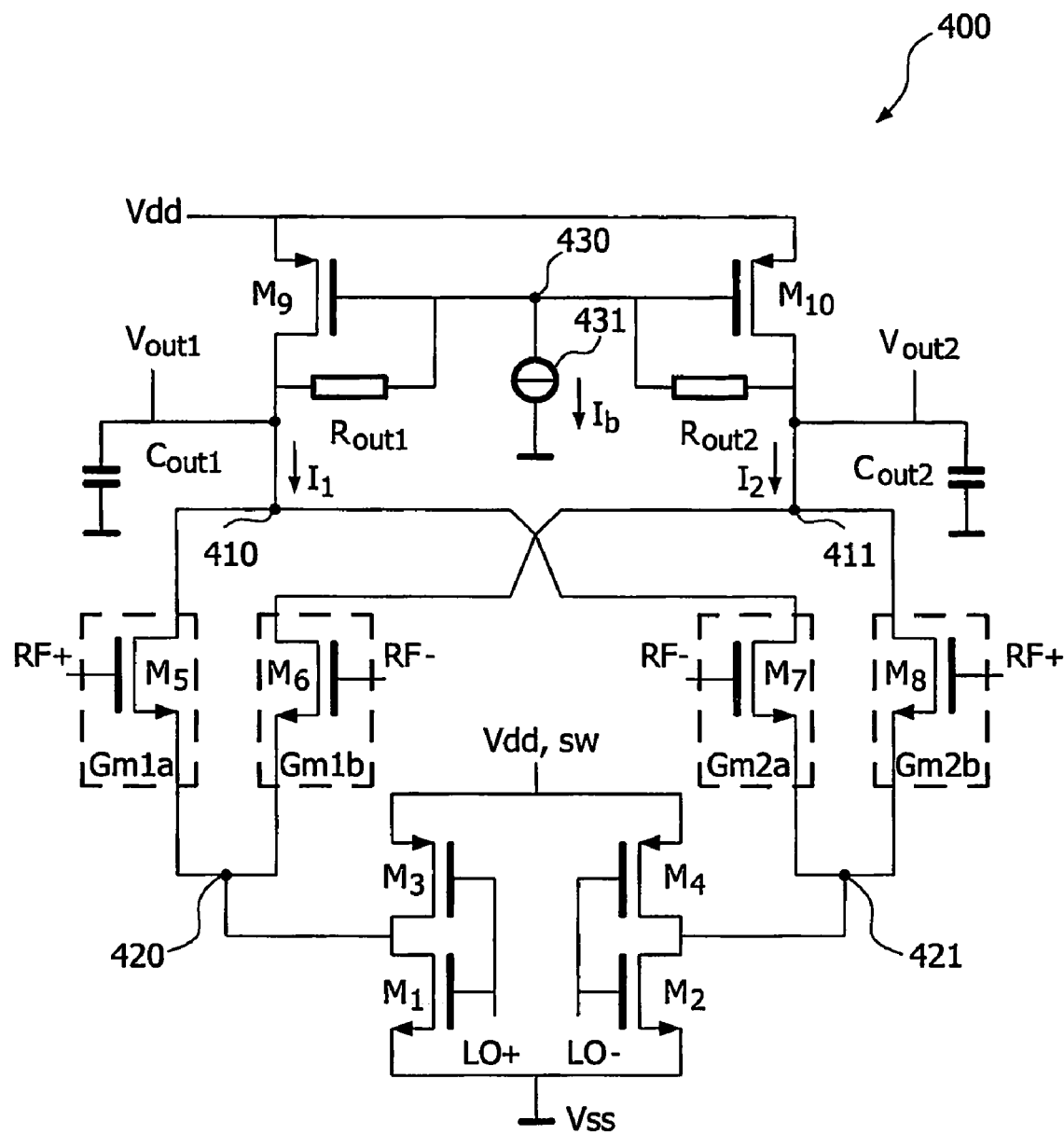
FIG. 4 shows a schematic circuit diagram of a an embodiment of a mixer circuit according to the invention realized as an integrated circuit.

FIG. 4 shows a schematic circuit diagram of a an embodiment of a mixer circuit 400 according to the invention realized as an integrated circuit. Mixer circuit 400 is driven by a differential radio frequency input signal comprising a first component RF+ and a second component RF−. The differential output signal of mixer circuit 400 comprises a first component Vout1 and a second component Vout2. The differential oscillator frequency driving the mixer circuit 400 comprises a first component LO+ and a second component LO+.

The mixer circuit 400 comprises four voltage to current converters or transconductors, GM1*a*, GM1*b*, GM2*a*, and GM2*b*, implemented by N-MOSFETs M5, M6, M7, and M8 respectively. The first component of the input signal RF+ is applied to the gates of M5 and M8, while the second component of the input signal RF− is applied to the gates of M6 and M7. The sources of M5 and M6 are connected to a first switching node 420, while the sources of M7 and M8 are connected to a second switching node 421. The drains of M5 and M7 are connected to a first output node 410. The drains of M6 and M8 are connected to a second output node 411.

Note that the transistors M5-M8 require a bias voltage to be applied to their gates for proper functioning. Therefore the first component of the input signal RF+ comprises a DC bias component, Vbias, and a superimposed AC component, +Vin, while the second component of the input signal RF− comprises the DC bias component, Vbias, and a superimposed AC component, −Vin, which is an anti-phase version of the signal +Vin.

The switches comprises two N-MOSFETs M1 and M2 and two P-MOSFETs M3 and M4. The first component LO+ of the oscillator signal is applied to the gates of M1 and M3, while the second component LO− of the oscillator signal is applied to the gates of M2 and M4. The drains of M1 and M3 are connected to the first switching node 420, while the drains of M2 and M4 are connected to the second switching node 421. The sources of M3 and M4 are connected to a positive switch power supply VDD,SW. The sources of M1 and M2 are connected to a negative power supply VSS.

The mixer circuit 400 further comprises an active load circuit for converting currents I1 and I2, into the first component VOUT1 and second component VOUT2 of the output signal. Currents I1 and I2 are the combined drain currents of M5 and M7, and the combined drain currents of M6 and M8 respectively. The load circuit comprises two P-MOSFETs M9 and M10. The sources of M9 and M10 are connected to a positive power supply VDD, which may be the same as the switch power supply VDD,SW. The drain of M9 is connected to the first output node 410, while drain of the M10 is connected to the second output node 411. The gates of M9 and M10 are connected to an internal node 430. The gates of M9 and M10 are biased by means of a bias current source 431 with a first terminal connected to internal node 430 and with a second node connected to a negative supply voltage, which may be the negative supply voltage VSS, providing a bias current IB. A first output resistor ROUT1 is connected between internal node 430 and the first output node 410, while a second output resistor ROUT2 is connected between internal node 430 and the second output node 411. A first output capacitor COUT1 is connected between the first output node 410 and a negative supply voltage, which may be VSS, while a second output capacitor COUT2 is connected between the second output node 411 and a negative supply voltage, which may be VSS.

The mixer circuit 400 has been realized to verify the mixer circuit according to the invention experimentally. It is a down conversion mixer was designed to operate at 1 Volt supply voltage. The mixer circuit 400, shown in FIG. 4 shows the schematic that was realized on chip: a straightforward simple implementation of the double balanced Switched Transconductor Mixer concept of FIG. 3. The transconductors are shown in the dashed boxes (M5-M8). Somewhat arbitrarily, the transconductance was chosen around 1 mS. Transistors M1 and M2 implement the switches to VSS, while M3 and M4 implement the switches to VDD. They are driven by anti-phase sine-wave signals around a common voltage equal to the inverter switch threshold (close to VDD/2). Note that sine-waves are used here for experimental reasons, but full swing digital signals can also be used, enhancing the compatibility with digital CMOS.

To generate an the differential output voltage signal VOUT1-VOUT2, an current to voltage (I-V) converter must be added. This is implemented by the common-mode current-absorption circuit with the two resistors, ROUT1 and ROUT2, and two P-MOSFETs, M9 and M10, in the upper part of FIG. 4. However, as such this circuit has a rather low common-mode output voltage. By adding the bias current source 431 providing the bias current IB, the common-mode output voltage is shifted up to a value around 0.6 Volt, to fit in the 1 Volt supply voltage. The mixer circuit 400 is designed for a maximum conversion gain of around 20 dB (ROUT1=ROUT2=10 kohm), which can be lowered adding an external resistor between the first and second output nodes 410 and 411. In that are discussed in the following, this resistor was chosen in the middle of the gain range to achieve 12 dB conversion gain. The mixer was fabricated in a standard industrial 0.18 µm CMOS process.

In measurements termination resistors of 50 ohm were added on chip for applying the radio frequency input signals RF+ and RF− and the oscillator signals LO+ and LO−, for ease of measurement. The chip was measured via wafer probing, using baluns for single to differential conversion at the input. A differential probe was used to measure the differential output voltage, the difference of VOUT1 and VOUT2. The IF bandwidth was 2 MHz, limited by the input capacitance of the probe (>10 MHz is easily obtainable with an on-chip load).

Figure 5:
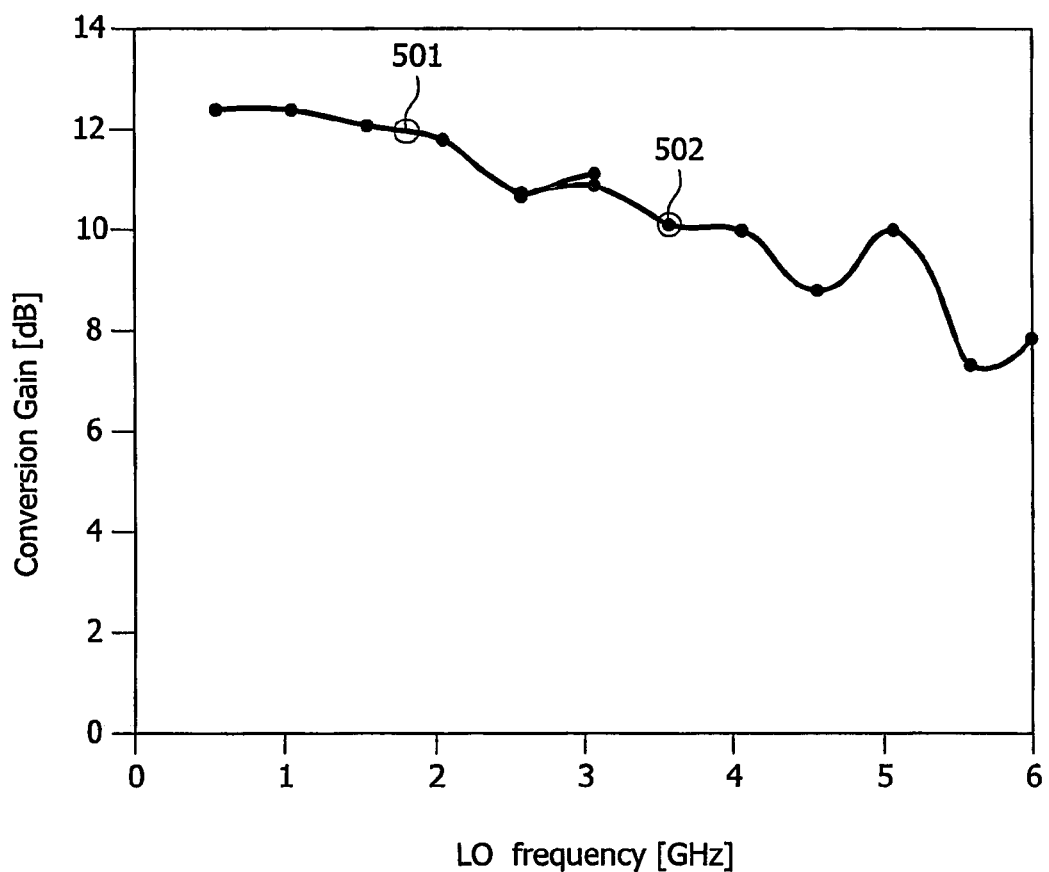
FIG. 5 shows graphs with measured conversion gain versus a local oscillator frequency for the mixer circuit according to the invention, shown in FIG. 4.

FIG. 5 shows graphs with measured conversion gain versus a local oscillator frequency for the mixer circuit according to the invention, shown in FIG. 4. The vertical axis shows the conversion gain in dB, while the horizontal axis shows the local oscillator (LO) frequency in GHz. Curves 501 and 502 represent the conversion gain of the mixer circuit 400 in dependence upon the local oscillator frequency.

The conversion gain as a function of frequency was measured using two baluns with overlap in frequency range: one for the 300 MHz-3 GHz band, curve 501, and one for 2-18 GHz, curve 502. Despite of experimental inaccuracies it can be concluded that the mixer has 12 dB conversion gain and around 4 GHz LO bandwidth, which is in reasonable agreement with simulation. The current consumption of the mixer consists of a more or less constant term of 180 µA for the transconductors core, and a dynamic term determined by the switching (≈200 µA/GHz). Note that the power consumption is low because the transconductance is rather low, resulting in a high equivalent input noise resistance. To achieve less than 15 dB noise fig. with respect to 50 ohm, roughly 10 times higher transconductance, i.e. 10 times more power consumption, is needed. At 1 GHz this will result in roughly 4 mW power consumption.

Figure 6:
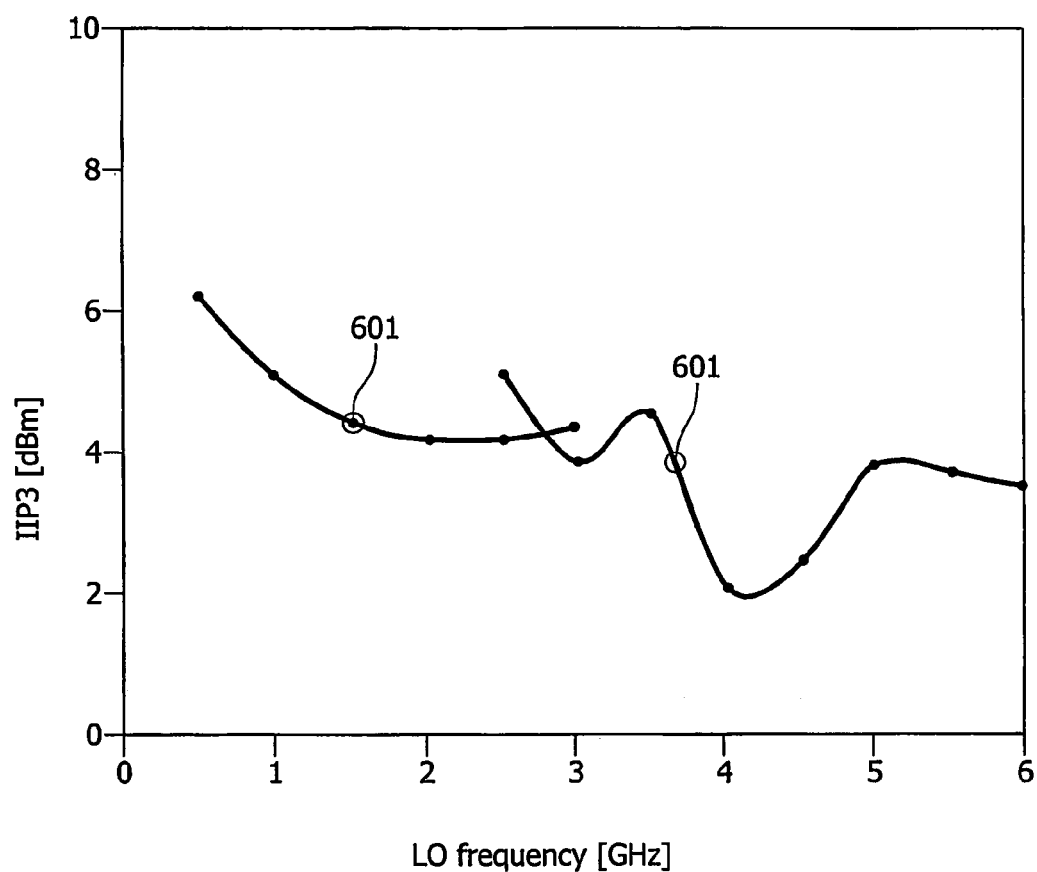
FIG. 6 shows graphs with measured linearity versus a local oscillator frequency for the mixer circuit according to the invention, shown in FIG. 4.

FIG. 6 shows graphs with measured linearity versus a local oscillator frequency for the mixer circuit according to the invention, shown in FIG. 4. The vertical axis shows the $3^{rd}$ order input referred intercept point (IIP3) in dB, while the horizontal axis shows the local oscillator (LO) frequency in GHz. Curves 601 and 602 represent the IIP3 of the mixer circuit 400 in dependence upon the local oscillator frequency. FIG. 6 shows the commonly used IIP3, since this describes the linearity of the mixer circuit by means of one parameter, thereby circumventing the need to describe for instance both the output range and the distortion.

IIP3 as a function of frequency was measured using two baluns with overlap in frequency range: one for the 300 MHz-3 GHz band, curve 601, and one for 2-18 GHz, curve 602. An IIP3 better than +4 dBm is typically achieved for 12 dB conversion gain. Simulations and experiments with varying output resistor showed that this linearity is limited by the output swing. Actually conversion gain and IIP3 can be traded. Simulations showed that an IIP3 in excess of +10 dBm is possible if the output voltage swing is reduced.

Figure 7:
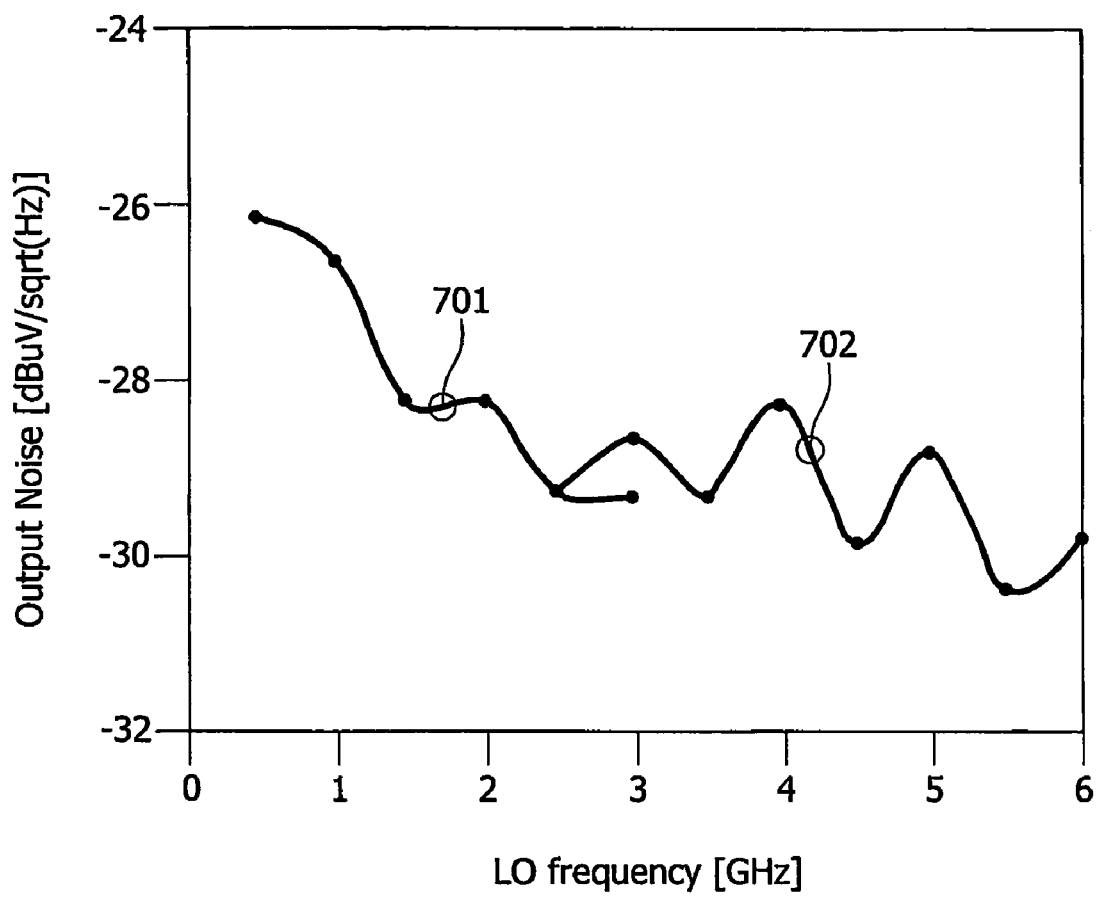
FIG. 7 shows graphs with measured output noise versus a local oscillator frequency for the mixer circuit according to the invention, shown in FIG. 4.

FIG. 7 shows graphs with measured output noise versus a local oscillator frequency for the mixer circuit according to the invention, shown in FIG. 4. The vertical axis shows output noise in dB µV/sqrt(Hz), while the horizontal axis shows the local oscillator (LO) frequency in GHz. Curves 701 and 702 represent the output noise of the mixer circuit 400 in dependence upon the local oscillator frequency.

The output noise as a function of frequency was measured using two baluns with overlap in frequency range: one for the 300 MHz-3 GHz band, curve 701, and one for 2-18 GHz, curve 702. FIG. 7 shows the output noise as a function of frequency, measured at 1 MHz IF frequency. The trend is similar to the conversion gain fall off, in agreement with the simulation results shown in FIG. 3. Also the values fit roughly to the noise current expected from the transconductor core according to simulation. The 1/f corner frequency was around 1 MHz.

Summarizing FIG. 4, FIG. 5, FIG. 6, and FIG. 7, a 1 Volt switched transconductor mixer has been realized in standard 0.18 μm CMOS, with 0.5 Volt threshold devices. It can operate at such low supply voltage, compatible with future digital CMOS, because only switches with a conductive channel connected to either VSS or VDD are used. In contrast to traditional active and passive CMOS mixers, the noise produced by the switch transistors is common-mode noise, which is rejected at the differential output. As a consequence, the output noise of the switched transconductor mixer does not increase with LO frequency, in contrast to known mixer circuits.

It will be clear to a person skilled in the art that different variations on the mixer circuit of FIG. 4 are possible. For instance:

A complementary implementations with P-MOSFETs replaced by N-MOSFETs and the other way around.

Using BJTs (bipolar junction transistors) instead of M5-M8 (preferred implementation in BiCMOS process, as BJT have much less 1/f noise).

Adding degeneration resistors in series with the transconductors (M5-M8) to increase the linearity.

Combining the circuit of FIG. 3 with its complementary version, so that bias currents of the N-type transconductors are re-used in the P-type transconductors. In order to reduce the required minimum power supply in this case, Vbias, of the N-type transconductance stage can be chosen equal to Vdd, while for the PMOSTs it can be chosen equal to Vss. DC biasing can be done by (high) resistors to Vss and Vdd respectively, while capacitors can provide the signal coupling. The outputs of the complementary mixer halves can be DC coupled, which is important for zero-IF down-conversion mixer applications.

Figure 8:
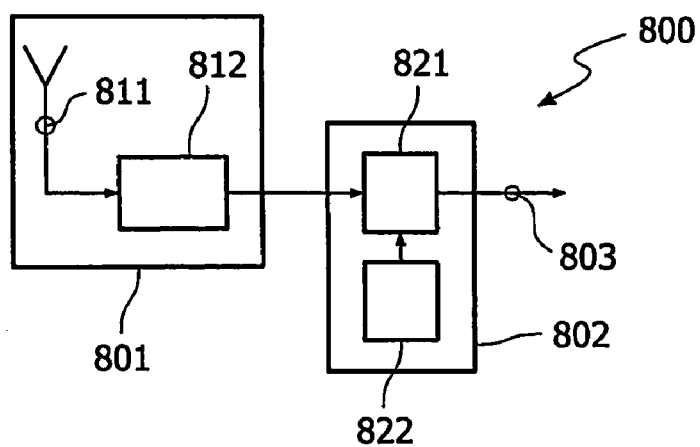
FIG. 8 shows a schematic diagram of a receiver comprising a mixer circuit according to the invention.

FIG. 8 shows a schematic diagram of a receiver comprising a mixer circuit according to the invention. The receiver 800 comprises an antenna section 801 and a receiver section 802. The antenna 801 is arranged for receiving radio frequency (RF) signals. The purpose of the antenna section 801 is to receive the RF signal and put it through to the receiver section 802. It comprises an antenna 811 and it may comprise a matching network 812 to match the impedance of the antenna 811 to the input impedance of the receiver section 803. The receiver section comprises a mixer circuit 821 according to the invention. This may by for instance the mixer circuit shown in FIG. 4. The receiver section further comprises a local oscillator 822 for generating a local oscillator signal. The received RF signal is mixed with the local oscillator signal for generating an output signal 803 at an intermediate frequency (IF). Note that FIG. 8 shows a basic concept. Usually a receiver comprises additional components, such as for instance a low-noise amplifier (LNA) to improve the performance.

A receiver as shown in FIG. 8 may be used in for instance a wireless communication device, such as a handset of a mobile phone, although it will be clear that other wireless communication devices are possible too. In such a wireless communication device the output signal 803 may be further processed in a processing unit. The processing unit may for instance to generate an audio signal in dependence upon the output signal 803.

In summary the mixer circuit according to the invention has a number of attractive features.

For instance, it can operate at very low supply voltages compatible with digital CMOS because all required switches connect nodes to either Vss or Vdd.

Further it is capable of high frequency operation because there is a direct connection of the transconductor output nodes to the current-outputs Iout1 and Iout2, without an "internal" node like n1 in FIG. 1. In the mixer of FIG. 1, capacitance from node n1 to ground is an important bandwidth limitation.

Moreover, the noise introduced by the switch transistors is COMMON MODE noise for the two active transconductors and results in common mode output noise currents. This noise cancels in the differential output current IOUT1-IOUT2, which means that the switches render negligible noise contribution. For the mixer in FIG. 1 the situation is drastically different. The switches M2-M3 of the mixer circuit in FIG. 1 introduce large peaks in the PSD of the noise at the zero crossings of the oscillator signal. This is because there is a direct noise current path between both outputs. When the LO+ and LO− have approximately the same voltage, both switches conduct and have significant noise current, resulting in noise peak around the zero crossing. This noise comes on top of the noise of the transconductance stage, and dominates at high frequencies where the "take-over region" constitutes a large part of the local oscillator signal period time. A similar effect occurs in passive mixers. In contrast, the switched transconductor mixer shows much less noise deterioration at high frequencies.

The switched transconductor mixer circuit according to the invention can work with plain full swing digital oscillator signals. The common mode voltage and amplitude are less critical as in known active mixer circuits, where the switch transistor preferably should remain in strong inversion and saturation to work as cascodes for the transconductor stage. Also the fact that noise of the switches is less critical as mentioned above makes the LO generation easier.

Applications in which the mixer circuit according to the invention may be used advantageously are for instance: low voltage CMOS transceiver in standard digital CMOS at low supply voltage; applications where high mixer bandwidth is required and the bandwidth of known active mixer circuits are limited by internal nodes; applications where a low noise fig. (NF) at a high local oscillator frequency is required and where switch take-over noise dominates noise fig.; and applications where use of a digital oscillator signal is desired. Digital oscillator signal generation becomes more and more feasible as speeds increase. Advantages of digital oscillators are for instance their flexibility and programmability, and they profit from Moore's law with respect to the scaling of the physical dimensions of integrated circuits.

The embodiments of the present invention described herein are intended to be taken in an illustrative and not a limiting sense. Various modifications may be made to these embodiments by persons skilled in the art without departing from the scope of the present invention as defined in the appended claims. It will be clear to a person skilled in the art that different variations on the embodiments of the mixer circuits according to the invention as shown in FIG. 2A, FIG. 2B, and FIG. 4 are possible. For instance: in alternative, complementary implementations, P-MOSFETs may be replaced by N-MOSFETs and the other way around; bipolar junction transistors (BJTs) may be used instead of M5-M8 (preferred implementation in BiCMOS process, as BJT have much less 1/f noise); and either of the mixer circuits of FIG. 2A and FIG. 2B may be combined with their complementary versions, so that bias currents of the N-type transconductors are re-used in the P-type transconductors. In order to reduce the required minimum power supply in this case, the bias voltage of the N-type transconductance stage can be chosen equal to VDD, while for the P-MOSFETs it can be chosen equal to VSS. DC biasing can be done by resistors, with a relatively high resistance, to VSS and VDD respectively, while capacitors can provide the signal coupling. The outputs of the complementary mixer halves can be DC coupled, which is important for zero-IF down-conversion mixer applications.

Furthermore known types of load networks used for Gilbert mixers can be applied, e.g.: resistors to VDD for wideband voltage conversion gain, while in addition capacitors can be added for low-pass filtering; a transimpedance amplifier; tuned band-pass LC networks for narrowband applications; a common mode current absorbing network with high differential resistance; and I/V converter via a transimpedance amplifier (e.g. in down-conversion mixers, where the frequencies are low enough to implement operational amplifiers (OPAMPs)).

The invention claimed is:

1. A mixer circuit comprising an input node for receiving an input signal, a first output node, and a second output node, voltage to current conversion means and switching means operatively coupled to each other and to the input node, the first output node and the second output node to generate a mixed input signal at the first output node and the second output node in response to an oscillator signal, wherein the voltage to current conversion means comprises a first voltage to current converter having a first control electrode coupled to the input node and a first main conductive path having a first output electrode coupled to the first output node and a first switching electrode coupled to the switching means; a second voltage to current converter having a second control electrode coupled to the input node and a second main conductive path having a second output electrode coupled to the second output node and a second switching electrode coupled to the switching means; and the switching means is arranged to couple: the first switching electrode to a first supply voltage and the second switching electrode to a second supply voltage during a first phase of the oscillator signal, and the first switching electrode to the second supply voltage and the second switching electrode to the first supply voltage during a second phase of the oscillator signal wherein at least one of the first supply voltage and the second supply voltage is fixed.

2. A mixer circuit as claimed in claim 1, wherein the first voltage to current converter and the second voltage to current converter are insulated gate field effect transistors whereby the gates are the respective control electrodes, the drains the respective output electrodes, and the sources the respective switching nodes.

3. A mixer circuit as claimed in claim 1, wherein the switching means comprises: a first switch for coupling the first switching electrode to the first supply voltage during the first phase of the oscillator signal and to the second supply voltage during the second phase of the oscillator signal; and a second switch for coupling the second switching electrode to the second supply voltage during the first phase of the oscillator signal and to the first supply voltage during the second phase of the oscillator signal.

4. A mixer circuit as claimed in claim 3, wherein the first switch is a first inverter circuit with a first switch output node coupled to the first switching node and a first switch input node for receiving the oscillator signal; and the second switch is a second inverter circuit with a second switch output node coupled to the second switching node and a switch second input node for receiving an inversed version of the oscillator signal.

5. A mixer circuit as claimed in claim 4, wherein the first inverter circuit and the second inverter circuit comprise transistors.

6. A mixer circuit as claimed in claim 5, wherein: the first inverter circuit comprises a first switch insulated gate field effect transistor of a first type with its drain coupled to the first switch output node, its source coupled to the first supply voltage, and its gate coupled to the first switch input node, and a second switch insulated gate field effect transistor of a second type with its drain coupled to the first switch output node, its source coupled to the second supply voltage, and its gate coupled to the first switch input node; and the second inverter circuit comprises a third switch insulated gate field effect transistor of the first type with its drain coupled to the second switch output node, its source coupled to the first supply voltage, and its gate coupled to the second switch input node, and a fourth switch insulated gate field effect transistor of the second type with its drain coupled to the first switch output node, its source coupled to the second supply voltage, and its gate coupled to the second switch input node.

7. A mixer circuit as claimed in claim 1, wherein the mixer circuit comprises a second input node for applying a second input voltage, whereby: the voltage to current conversion means comprises; a third voltage to current converter with a third control electrode coupled to the second input node, and a third main conductive path with a third output electrode coupled to the second output node and a third switching electrode coupled to the switching means; a fourth voltage to current converter with a fourth control electrode coupled to the second input node, and a fourth main conductive path with a fourth output electrode coupled to the first output node and a fourth switching electrode coupled to the switching means; and the switching means is arranged to couple: the third switching electrode to the first supply voltage and the fourth switching electrode to the second supply voltage during the first phase of the oscillator signal, the third switching electrode to the second supply voltage and the fourth switching electrode to the first supply voltage during the second phase of the oscillator signal.

8. A receiver for receiving radio frequency signals comprises an antenna section coupled to a receiver section, having a local oscillator for generating an oscillator frequency, being arranged to output a signal at another frequency, wherein the receiver section comprises a mixer circuit as claimed in claim 1 for mixing the oscillator signal with the radio frequency signals.

9. A wireless communication device comprises a receiver coupled to a signal processing section for processing the signal at the lower frequency generated by the receiver, wherein the receiver is a receiver as claimed in claim 8.

10. A method for generating an output signal by mixing an input signal with an oscillator signal, whereby the output signal comprises a first output current and a second output current, in a mixer circuit comprising an input node for receiving the input signal, a first output node for providing the first output current, and a second output node for providing the second output current, voltage to current conversion means and switching means operatively coupled to each other and to the input node, the first output node, and the second output node to generate the output signal at the first output node and the second output node in response to the oscillator signal, wherein the voltage to current conversion means comprises a first voltage to current converter having a first control electrode coupled to the input node and a first main conductive path having a first output electrode coupled to the first output node and a first switching electrode coupled to the switching means; a second voltage to current converter having a second control electrode coupled to the input node and a second main conductive path having a second output electrode coupled to the second output node and a second switching electrode coupled to the switching means; and the switching means coupling: the first switching electrode to a first supply voltage and the second switching electrode to a second supply voltage during a first phase of the oscillator signal, and the first switching electrode to the second supply voltage and the second switching electrode to the first supply voltage during a second phase of the oscillator signal, wherein at least one of the first supply voltage and the second supply voltaee is fixed.

* * * * *